(12) United States Patent
Cook et al.

(10) Patent No.: US 6,174,814 B1
(45) Date of Patent: Jan. 16, 2001

(54) METHOD FOR PRODUCING A CRACK STOP FOR INTERLEVEL DIELECTRIC LAYERS

(75) Inventors: Robert F. Cook, Putnam Valley; Eduardo Garcia, Newburgh; Nancy A. Greco; Stephen E. Greco, both of Lagrangeville; Ernest N. Levine, Poughkeepsie, all of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/557,537

(22) Filed: Apr. 25, 2000

Related U.S. Application Data

(62) Division of application No. 09/067,905, filed on Apr. 28, 1998, now Pat. No. 6,091,131.

(51) Int. Cl.[7] .................................................. H01L 21/00
(52) U.S. Cl. ........................... 438/692; 216/88; 438/745; 438/756
(58) Field of Search ..................... 438/691, 692, 438/745, 756; 216/21, 38, 88, 99; 257/629

(56) References Cited

U.S. PATENT DOCUMENTS

| | | | |
|---|---|---|---|
| 4,536,251 | * 8/1985 | Chiang et al. | 438/756 X |
| 4,721,548 | * 1/1988 | Morimoto | 438/756 X |
| 4,897,154 | * 1/1990 | Chakravarti et al. | 438/756 X |
| 4,976,814 | 12/1990 | Blumenshine et al. | |
| 4,992,326 | 2/1991 | Dabi | |
| 5,024,976 | 6/1991 | Mehrotra et al. | |
| 5,084,752 | 1/1992 | Satoh et al. | |
| 5,246,884 | 9/1993 | Jaso et al. | |
| 5,516,729 | 5/1996 | Dawson et al. | |
| 5,530,280 | 6/1996 | White | |
| 5,665,655 | 9/1997 | White | |

FOREIGN PATENT DOCUMENTS

| | | |
|---|---|---|
| 7-86284 | 3/1995 | (JP) |
| 6-232256 | 11/1995 | (JP) |

OTHER PUBLICATIONS

IBM Technical Disclosure Bulletin, vol. 27, No. 8 (Jan. 1985).

U.S. Patent Application Ser. No. 07/998,163, by E. J. White, entitled Process for Producing Cracks on Semiconductor Devices and Devices Containing the Crackstops.

*Acta metall.* by M. D. Thouless, entitled Decohesion of Films with Axisymmetri, Geometries, vol. 36, pp. 3131–3135, 1988.

Journal of Materials Science by M. D. Thouless entitled Delamination from Surface Cracks in Composite Materials, vol. 24 (1989) pp. 1406–1412.

* cited by examiner

*Primary Examiner*—William Powell
(74) *Attorney, Agent, or Firm*—Ratner & Prestia; Jay H. Anderson, Esq.

(57) ABSTRACT

The propagation of a crack from the surface of the dielectric layer of an integrated circuit, through to the underlying circuit elements, is prevented by controlling the interface between the outermost, dielectric layer or layers and the inner layer or layers of the integrated circuit construction. The interface is weakened so that a crack that encounters the interface is caused to propagate in a horizontal manner, along the interface, preventing propagation of the crack in a direction that would be harmful to the manufactured article. This is preferably accomplished with multiple layers of material, each of which is made capable of redirecting (deflecting) the crack. Deflection of the crack, and arrest of the deflected crack along the interface, is made possible by controlling the fracture resistance of the interface.

17 Claims, 5 Drawing Sheets

METHOD FOR PRODUCING A CRACK STOP FOR INTERLEVEL DIELECTRIC LAYERS

This application is a divisional of U.S. patent application Ser. No. 09/067,905, filed on Apr. 28, 1998, which has been allowed, as U.S. Pat. No. 6,091,131.

TECHNICAL FIELD

The present invention is directed generally to the manufacture of integrated circuits and, in particular, to the prevention of cracking and crack propagation in the dielectric materials that surround underlying circuit elements.

BACKGROUND OF THE INVENTION

In the course of manufacturing an integrated circuit, common practice is to first develop desired semiconductor circuit elements and the corresponding interconnections on an appropriate substrate, followed by the application of a dielectric material over the resulting structure for purposes of protecting the relatively fragile underlying elements. This is conventionally followed by a process for leveling irregularities in the dielectric overlayer to restore topological planarity to the manufactured component. Chemical-mechanical polishing (CMP) of the surface of the applied dielectric material is commonly used for such purposes.

Chemical-mechanical polishing has a disadvantage, however, in practice: the CMP process can itself damage or scratch the surface of the wafer being formed. Scratches can occur, for example, by dragged or rolling contact from particles present in the polishing pad, from the polishing slurry, or from the wafer itself. Cracks can be nucleated and initiated from such scratches or other particle contacts and propagated by tension in the wafer arising from CMP fixturing, and the stress-corrosive properties of the reactive CMP solution. The analysis of manufactured complementary metal-oxide-semiconductor (CMOS) products has revealed that scratches can lead to cracks propagating downwardly through one or more of the layers positioned beneath the polished surface.

For example, in manufacturing CMOS products, it has been found that a scratch occurring during the metal conductor/glass CMP step can initiate a crack that propagates through several layers of material, including the gate stack (which is itself a very brittle structure). Electrically, such a crack can be detected as an "open" gate. Analysis of such failures (using a scanning electron microscope) reveals that such cracking can dislocate the gate stack leading to a physical break in the gate, which prevents current from passing through the structure. Although the scratch can be partially removed from the surface layer by subsequent polishing, the crack has already damaged the lower layers of the manufactured article.

Therefore, the primary object of the present invention is to prevent cracks initiated in the surface of a dielectric material from propagating downwardly, into the underlying layers of a manufactured integrated circuit. Another object of the present invention is to prevent cracks initiated in the surface of a dielectric material from propagating downwardly, into underlying layers, in a way that is fully compatible with the existing processes used to manufacture integrated circuits, and that itself requires the use of a minimal number of additional manufacturing steps.

SUMMARY OF THE INVENTION

To achieve these and other objects, and in view of its purposes, the present invention provides an interface between the outermost (dielectric) layer or layers and the inner layer or layers forming the integrated circuit so that cracks resulting from scratches formed in the surface of the dielectric material are prevented from propagating through to the inner layer or layers.

The improvements of the present invention can be implemented by depositing a layer of a "dissimilar material" (e.g., a polymer such as polyimide, or a material having equivalent properties) over the inner layer or layers forming the integrated circuit, followed by the conventional application of an outer, dielectric layer (e.g., silicate glass). As a result, during subsequent CMP processing, a crack formed in the surface of the dielectric only propagates through the outer, dielectric layer, stopping or arresting at or in the dissimilar layer. Different sequences of dielectric layers can be used, if desired, to achieve still further improvements (e.g., a trilayer structure including the layers glass/dissimilar material/glass, or with the dissimilar material deposited or applied first, becoming the bottom layer).

Selection of the dissimilar material in general depends on the thermal and dielectric properties of the material, as well as its mechanical properties. The thermal properties of the dissimilar material must be compatible with the subsequent processing (integration) steps. The dielectric properties must further meet the reliability and performance requirements for the product. The mechanical properties will determine if the material is capable of preventing a crack from propagating, in effect producing an interlevel crack stop.

It has been suggested previously to insert a layer of material in the oxide layer and over the gate, in order to protect the gate, by arresting the potential crack in the inserted material. For example, Japanese Patent No. 7-86284 discloses the placement of a layer of spin-on glass (SOG) over the gate structure of a semiconductor device in order to arrest the crack in the SOG layer. U.S. Pat. No. 5,246,884 discloses the use of carbon-rich materials such as chemical vapor deposition (CVD) diamond-like carbon (DLC) overlayer etch stop. Materials such as SOG and DLC are themselves relatively brittle, however, and tend to facilitate the propagation of cracks rather than to prevent their propagation.

The use of a polymer such as polyimide as a crack stop layer has been found to be effective for various reasons. For example, it has been found that when a crack enters a layer of the polyimide material, which is somewhat plastic, propagation of the crack will be resisted due to energy absorption within the new material provided that a sufficiently thick layer is used. To make use of such a mechanism (i.e., energy absorption due to plasticity), it is necessary to use a relatively soft material, such as polyimide. In practice, however, there is a reluctance to incorporate materials such as polyimide into the body of a wafer for reasons of reliability.

In accordance with the present invention, it has further been found that some materials and processes can serve as an effective crack stop layer because the properties of the interface formed with the inserted material layer or by the inserted process tend to cause a crack that encounters the interface to propagate in a horizontal manner, along the interface, preventing propagation of the crack in a direction that is harmful to the manufactured article. This has been found to result from the presence of a lateral weakness at this interface, that diverts the propagation of the crack along the weakened interface rather than by arrest of the crack at or in an inserted layer. Moreover, it has been found that this effect can be achieved with materials other than polyimide, including materials that are more compatible with, and preferred for use in, the manufacture of integrated circuit components. Such effects are generally achievable with any interface having a lateral weakness responsive to crack propagation.

The present invention is primarily directed to the use of multiple layers of material, each of which is sufficiently thick to perturb a crack (e.g., a minimum thickness of about 50 Å). A main attribute of the present invention is the presence of multiple interfaces, each of which serves to horizontally deflect a propagating crack. Control of the fracture resistance of the interface is important because, the weaker the interface, the more likely that the crack will deflect along the interface. In practice, however, if the interface is made too weak, the resulting (layered) structure will not hold during the manufacturing process. Accordingly, there will generally be an optimum range for the fracture resistance of the interface, depending on the materials incorporated.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION OF PREFERRED EMBODIMENTS

Figure 1A:
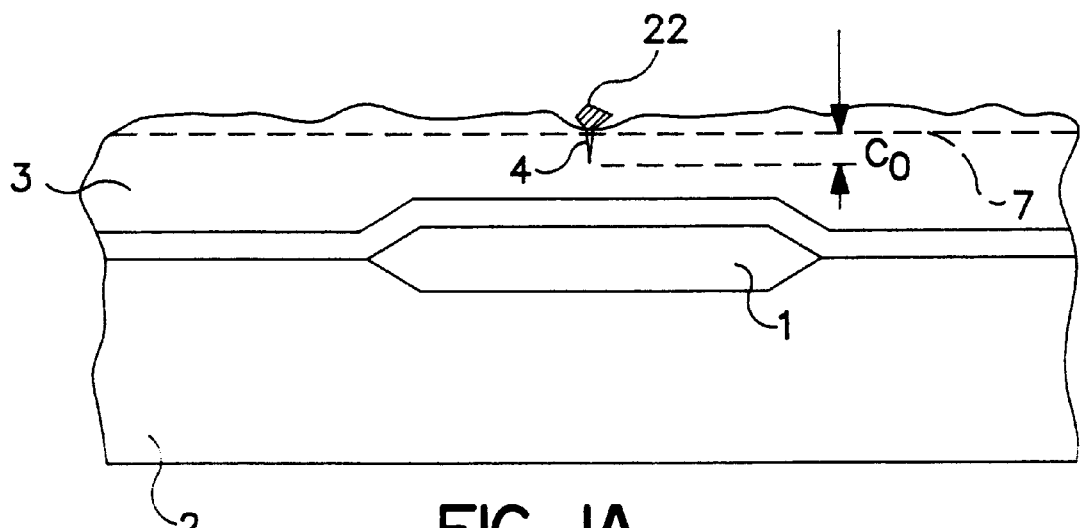
FIGS. 1A and 1B are schematic illustrations of a conventional wafer structure that does not incorporate the improvements of the present invention.

In accordance with the present invention, the propagation of cracks through the several layers of a manufactured integrated circuit is inhibited by providing multiple layers of a material (or materials) of a certain minimum thickness, that are compatible with the manufacturing process and that are formed with controlled interface fracture resistance so that a propagating crack will be directed (or forced) to propagate horizontally in small increments, in this way preventing harm to the manufactured article. The following description illustrates preferred materials and manufacturing processes, both exsitu (i.e., by removing the part from a tool) and insitu (i.e., by performing the material depositions within the tool), with the understanding that any of a variety of equivalent materials and processes may be used to achieve a similar result.

In terms of materials, the improvements of the present invention are best implemented using spin-on glass (SOG), an inorganic oxide having the general composition:

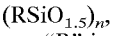

where "R" is any organic group, plus hydrogen, and "n" is any number. Admixtures of spin-on glasses, or a material selected from the general class of silicones, including silanes or silane-coupling agents, can also be used if desired.

The multiple layers of material of the present invention can be implemented exsitu with thin layers of SOG interwoven between an insulator deposition such as undoped silica glass (USG), for example, formed by chemical vapor deposition of silane or tetraethylorthosilane (TEOS) to form a silicon oxide, borosilicate glass (BSG), phosphosilicate glass (PSG), fluorosilicate glass (FSG), and combinations of glasses or other insulators. In such case, it may in appropriate circumstances first be necessary to take the part out of the insulator deposition tool and to re-insert the part in the tool, in a back and forth motion, to achieve the multiple layers. It would also be possible, however, to incorporate a spin-on glass chamber into a depositing tool, if desired.

The multiple layers of material of the present invention can also be implemented insitu by depositing a standard material such as TEOS oxide, pausing, and turning on a gas (or gases), with or without plasma, that will then alter the surface, followed by the return to a conventional TEOS deposit. In this way, the same material can be used for all of the multiple layers by, in effect, inserting slightly poisoned interfaces. As an alternative, rather than poisoning the intervening interface, a different plasma gas can be used to deposit a new material, with the new material having a weak interface with respect to the original layer.

Various agents can be used to develop the poisoned interfaces between the multiple layers. The use of F is preferred for such purposes, although effective results can also be achieved with equivalent agents selected from Group VII (other halogens, including Cl and Br), from Group I (including Li, Na, and K), from Group II (including Mg, Ca, Sr, and Ba), and from Group V (including P).

Multiple susceptible interfaces are presently considered necessary so that no one interface is so weak as to cause a structural weakness in the totality of the wafer. The use of multiple interfaces is otherwise known in the manufacture of integrated circuits (e.g., a deposit-etch process can have unlimited deposit-etch steps to effect planarization of the oxide). In such cases, however, a sharp interface is not produced, and it becomes important to assure that the interfaces are at least as strong as the parent structure. In the present case, a controlled weakening of the interface is used to horizontally deflect a crack.

A common oxide material presently used over gate structures, which is well suited to subsequent planarization by a CMP process, is BPSG (borophosphosilicate glass). The formation of cracks, and subsequent damage to the gate as a result of such cracks, is not uncommon with the use of BPSG. Moreover, the thin nitride that is conventionally placed over the gate, and which is also in the path of a propagating crack, is itself as brittle as the oxide layer. Other oxide insulator materials can also be used, such as PECVD (plasma-enhanced chemical vapor deposition) USG, BSG, PSG, FSG oxide layers, if desired. Because all such oxide insulators are subsequently planarized (by a CMP process), however, they are susceptible to damage of the type previously described. Irrespective of the material used, controlled, weakened, thin layers or interfaces inserted into the brittle insulator material, substantially parallel to the surface of the gate but which generally follow the topography of the underlying gate structure, prevent the potential for damage inherent in the use of such materials.

Figure 1B:
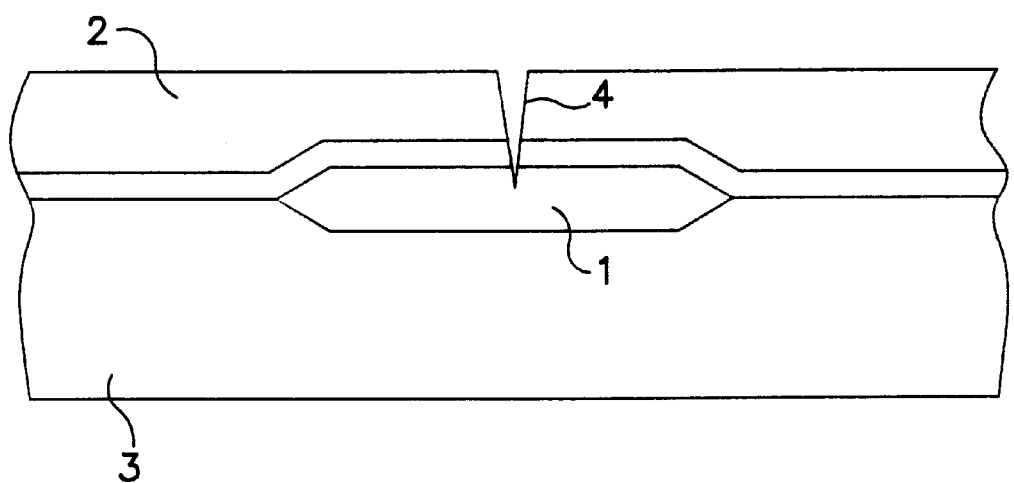
Figure 2A:
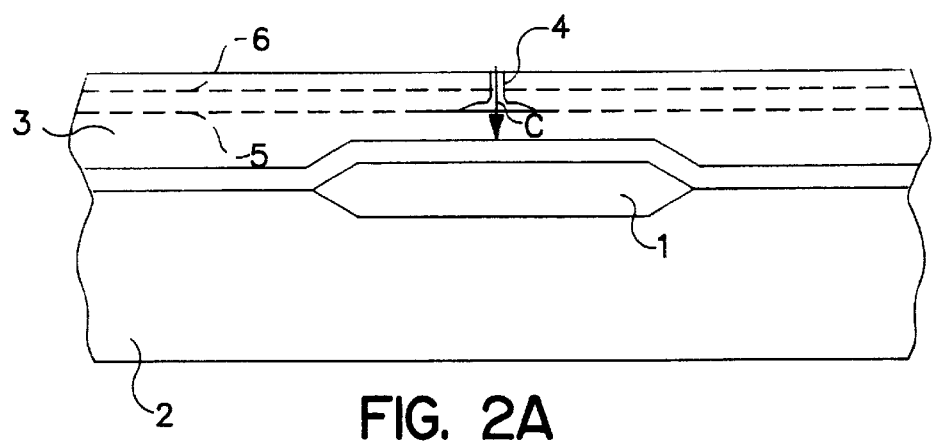
FIGS. 2A and 2B are corresponding illustrations of the wafer structure shown in FIGS. 1A and 1B, demonstrating the improvements of the present invention for a linear crack.

FIG. 1A diagrammatically illustrates a gate 1 formed on a silicon substrate 2, with the normal overburden of a borosilicate glass (BSG) insulator layer 3, before CMP processing. FIG. 1B shows the penetration of a crack 4 (shown in its initial stages in FIG. 1A following nucleation by a particle 22) into the gate 1, with a normal (uncontrolled) overburden structure, following CMP processing. FIG. 2A shows a corresponding structure, which further includes weakened interfaces 5, 6 in accordance with the present invention (e.g., inserted at a distance of about 1000 Å up from the top of the gate, and 4000 Å up from the top of the gate, respectively). The total thickness of the insulator is variable, but will normally be approximately 5000 Å over the gate 1 after CMP processing (shown schematically at 7 in FIG. 1A). The number and location of the controlled weakened interfaces is variable. A minimum of two weakened interfaces (as shown) is presently considered desirable, although not required, to provide redundant protection for the structure.

Figure 2B:
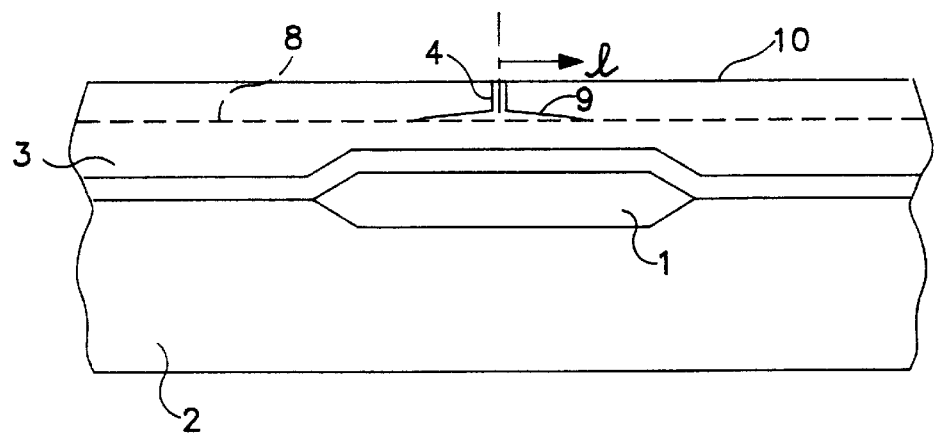

A key improvement of the present invention is that, unlike prior attempts to stop cracks, a propagating crack is deflected along a weakened layer (interface), adjacent to the original crack but generally perpendicular to the crack, to prevent further extension of the crack downward (vertically) into the multilayered structure. This effect is shown in FIG. 2B, using the case of only one interface 8 for purposes of simplicity. As previously indicated, however, the use of plural, redundant interfaces would generally be preferred in actual implementation. The lateral (side-wise) extension 9 of the crack 4, as shown in FIG. 2B, is limited and will not propagate indefinitely if the character of the controlled interface 8 (primarily measured in terms of the fracture resistance of the interface, as will be discussed more fully below) is within a correct range of allowable values.

Modeling of the foregoing improvements has shown that a relatively wide range of fracture resistance values for the interface will yield a stable side-wise propagation of a crack of fixed length. This side-wise propagation 9 is, in its length (extent), approximately equal to the depth (the distance down) of the interface 8 from the top 10 of the insulator material. As an example, for the previously described case where the interface is 1000 Å down from the top of the insulator material, the resulting side-wise extension would be 1000 Å. The particular fracture resistance value selected for a particular layered structure (i.e., a given weakened interface) must be established empirically, by experimentation. The derived model to be discussed more fully below shows, however, for a linear crack, that the fracture resistance at the interface should be between one-eighth and one-quarter of the fracture resistance of the insulator material, and for a generally circular crack, that the fracture resistance at the interface should be between zero and one-third of the fracture resistance of the insulator material.

Various processes can be used to implement the weakened interface of the present invention. For example, the oxide deposition step can be interrupted, and a gas such as F can be briefly inserted into the chemical stream. Modeling suggests that such an interface could also be created, during deposition, by an intermediate surface treatment which leaves a weakened non-primary bonding interface or, as an alternative, by depositing a very thin layer of another material (e.g., 50 Å) that is itself bonded to the adjacent layers, but which is itself weakly resistant to fracture. The interface utilized will be continuous in the case of an interrupted deposition, but could be discontinuous in the case of a weakened thin layer if subsequently selectively removed (by photolithography steps) to leave the resulting layer only over the gate.

If an intermediate layer is used, the intermediate layer should be extremely thin (i.e., less than about 200 Å) so as not to disturb the elastic stress field produced in the structure and thereby alter the crack-driving force (field). This thin requirement is to be distinguished from the requirements of previously implemented crack stop solutions, which use a viscous layer to retard the crack. In the case of a controlled weakened interface, a thickness cannot be specified because, in practice, such interfaces have an undetermined thickness. For either case, the interface (or pseudo-interface) created by the thin layer will tend to follow the contours of the underlying material (i.e., the gate shown in the several figures) because the thin layer is deposited by interrupting a non-planar deposition process.

The following physical model has been derived as a basis for the stabilization of propagating cracks by horizontally deflecting such cracks in accordance with the present invention. The results obtained show that the range of reduced energies required is fairly broad, so as to be easily achieved.

For this model, let it be assumed that surface cracks or gaps are being generated in BSG overlayers during planarization using a conventional CMP process (i.e., as shown in FIG. 1A), and that such cracks are propagating through the BSG and into the underlying gate oxides of devices farmed in silicon wafers (FIG. 1B). Such cracks can be nucleated by large particles in the CMP slurry, and then initiated and propagated by tension arising from the CMP fixturing and from the stress-corrosive conditions of the reactive CMP solution.

Figure 2C:
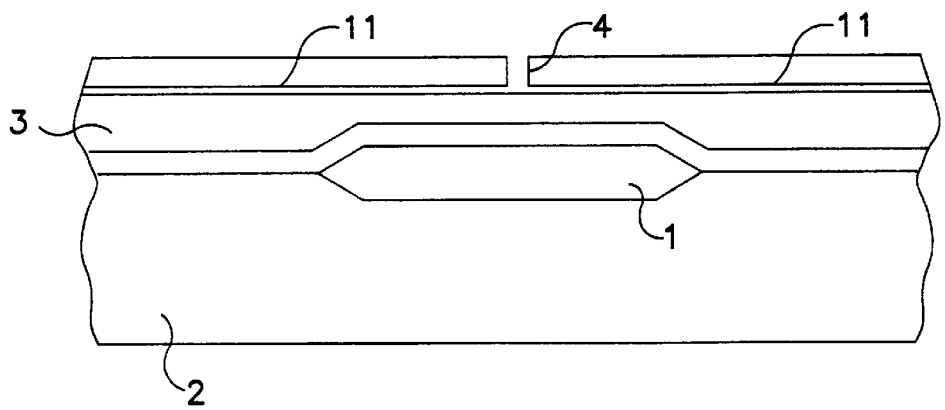
FIG. 2C is a schematic illustration of the wafer structure shown in FIGS. 2A and 2B, showing a linear crack that has been deflected, but not arrested.

In accordance with the present invention, and to inhibit propagation of the cracks to the underlying layers, layers are inserted into the BSG film, parallel to the film surface and with weakened interfaces, so that cracks initiated and propagating perpendicular to the film surface (toward the underlayers) are deflected along the layer, or along the interface, generally parallel to the surface (FIG. 2A). As a result, the crack is arrested within the layer or interface (FIG. 2B), adjacent to the original crack and without the continued extension schematically shown at 11 in FIG. 2C.

The mechanics of such a system, and corresponding variables in the materials used, have been modeled and will now be described with reference to the following general definitions:

G: Crack driving force (often called the mechanical energy release rate) is the amount of energy per crack area available for cracking.

R: Fracture resistance (often equivalent to the fracture surface energy, $2\gamma$) is the amount of work per crack area required to generate a fractured surface in the fracture environment. R is often greater than $2\gamma$ for cases in which the crack is under mixed-mode (shear and tension) loading.

A: Crack Area.

c or l: Crack length is defined, for linear cracks, as $A=wc$, where w is the crack width. For circular cracks, $A=\pi c^2$, where c is the crack radius.

v: Linear crack velocity is the change in the crack length c with time. The v(G) relation is a steeply increasing function of G such that v=0 for G=R, and v>>0 for G>R.

Equilibrium: A condition producing a zero net driving force for fracture, G=R. The crack velocity is zero at this point.

Non-Equilibrium: A condition producing a net driving force for fracture. Of importance is the condition G>R, for which the crack velocity is positive and the crack extends.

Stabilizing Field: A crack driving force that decreases with crack extension.

Destabilizing Field: A crack driving force that increases with crack extension.

Neutral Field: A crack driving force that is invariant with crack extension.

Transient Field: A crack driving force that alters its stabilizing nature with crack extension.

Stable Equilibrium: Equilibrium in a stabilizing field, such that a perturbation in the crack extension causes the system to return to the equilibrium condition. Non-equilibrium cracks approaching a stable equilibrium point exhibit decreasing velocity.

Unstable Equilibrium: Equilibrium in a destabilizing field, such that a perturbation in the crack extension causes the system to depart from the equilibrium condition. Non-equilibrium cracks departing an unstable equilibrium point exhibit increasing velocity.

Neutral Equilibrium: Equilibrium in a neutral field, such that a perturbation in the crack extension is maintained.

Steady-State: Non-equilibrium in a neutral field, such that the crack velocity and G−R is constant. Non-equilibrium cracks approaching steady-state conditions exhibit decreasing acceleration to the steady-state velocity.

For a linear crack propagating downwardly into the layered structure (i.e., the wafer of FIG. 1A), the crack driving force G is destabilizing and is given by:

$G\downarrow = 4\sigma^2 c/\overline{E}$, where $\sigma$ is the uniform applied stress over the crack and $\overline{E}$ is the modulus appropriate to the symmetry constraints on the crack:

$\overline{E}=E$ Plane stress, thin sections,
$\overline{E}=E/(1-v^2)$ Plane strain, thick sections, where E is the Young's modulus and v is the Poisson's ratio.

At any crack depth c, the initial driving force for the crack to deflect perpendicular to its path and travel parallel to the surface (FIG. 2A) is given by:

$$G_{\leftrightarrow}^{\infty} = \sigma^2 c/\overline{E} = G\downarrow/4, \qquad l \ll c.$$

This driving force is initially stabilizing and decreases with the deflected crack length 1 (FIG. 2B) until, for long reflections (FIG. 2C), the driving force plateaus at a lower-bound neutral condition:

$$G_{\leftrightarrow}^{\infty} = 0.5\sigma^2 c/\overline{E} = G_{\leftrightarrow}^0/2 = G\downarrow/8 \qquad l \gg c.$$

The stabilizing-to-neutral transient is described by:

$$G_{\leftrightarrow} \simeq G_{\leftrightarrow}^0\left[1 - \frac{l/c}{2(0.6 + l/c)}\right]. \qquad 0 \le l \le 5c.$$

Figure 3A:
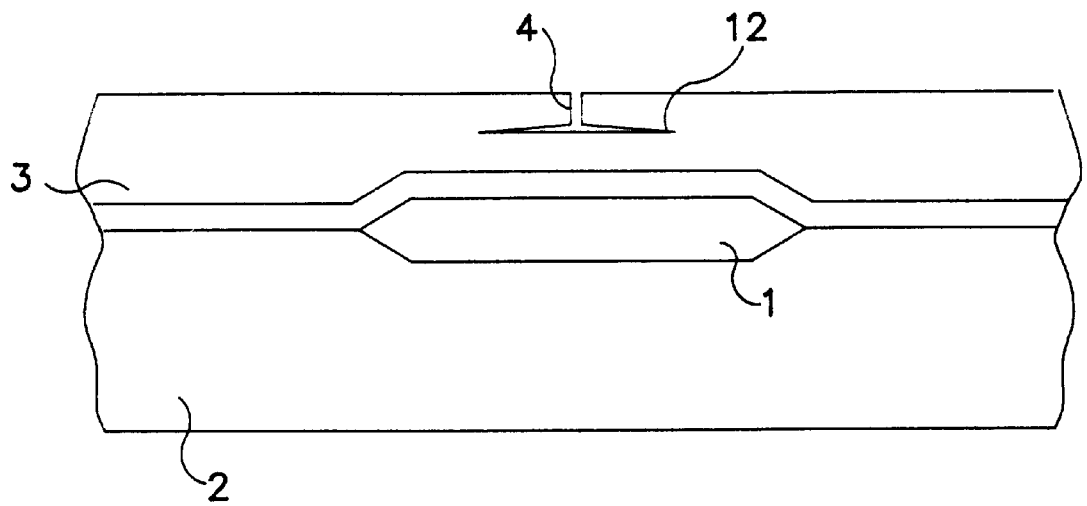
FIG. 3A is a schematic illustration of the wafer structure shown in FIGS. 2A and 2B, showing a linear crack that has been deflected and arrested.
Figure 3B:
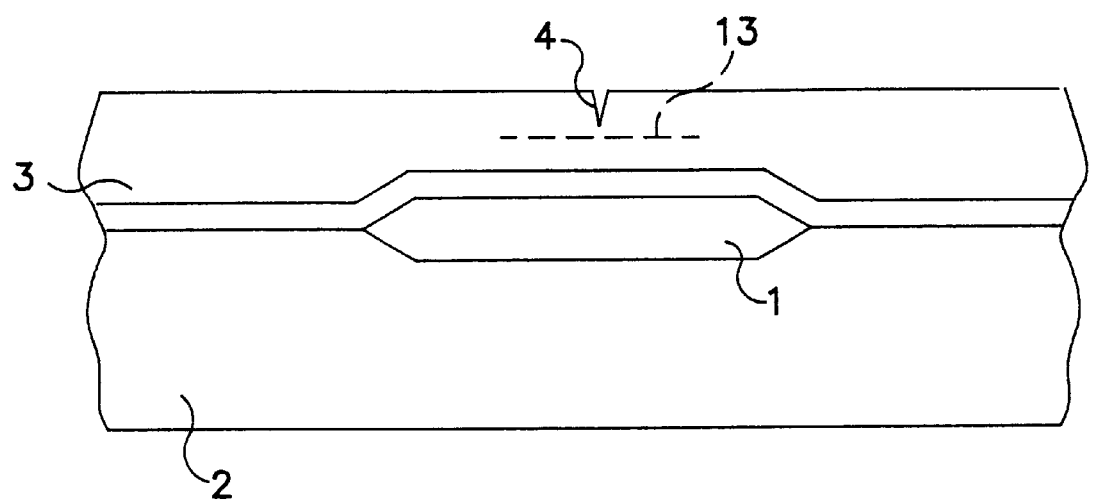
FIG. 3B is a schematic illustration of the wafer structure shown in FIGS. 2A and 2B, showing a crack in the presence of a truncated, weakened interface.

(i) a small defect in the overlayer, of effective size $c_0$ (FIG. 1A), will propagate from a position of unstable equilibrium with increasing velocity (FIG. 1B) if the condition:

$c_0 \ge R_{mat}\overline{E}/4\sigma^2$, is met, where $R_{mat}$ is the fracture resistance of the BSG material in the CMP solution;

(ii) an interface or thin layer in the BSG with reduced fracture resistance at a depth c will cause the crack to deflect (FIG. 2A) with decreasing velocity (FIG. 2B) if the condition:

$R_{int} \le R_{mat}/4$, is met, where $R_{int}$ is the fracture resistance of the interface or layer;

(iii) the deflected crack will arrest, as shown at 12 in FIG. 3A, if the condition:

$R_{int} \ge R_{mat}/8$, is met. In particular, the deflected part of the crack will arrest at a length equal to its depth for:

$R_{int}=R_{mat}/5.8$ (arrest at l=c), and at a length equal to half its depth for:

$R_{int}=R_{mat}/5.2$ (arrest at l=c/2); and (iv) the deflected crack will arrest if the condition:

$R_{int} \le R_{mat}/8$ is met and the weakened interface or layer is not continuous in the BSG, but truncates at a short length, as shown at 13 in FIG. 3B. In such case, a stable equilibrium configuration is attained by the equality of the neutral crack driving force intersecting an increasing fracture resistance, rather than by a stabilizing crack driving force intersecting a fixed fracture resistance. If the weakened layer is not truncated, the deflected crack will propagate continuously in a steady-state condition.

Figure 4A:
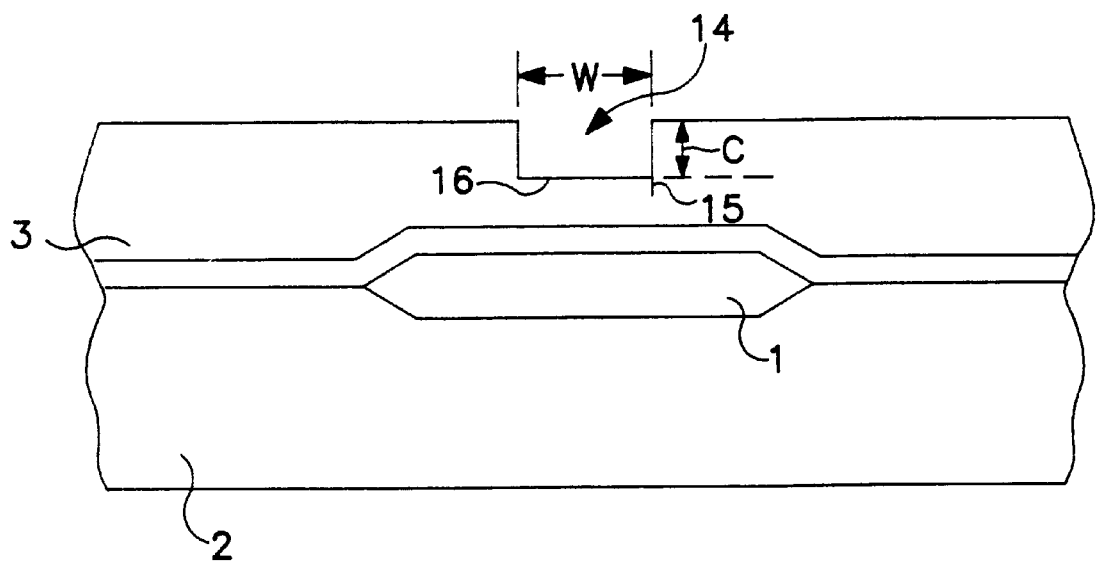
FIGS. 4A and 4B are corresponding illustrations of the wafer structure shown in FIGS. 1A and 1B, demonstrating the improvements of the present invention for a circular hole.

Let it now be assumed that material has been removed from the BSG layer, above the gate, leaving a shallow circular hole 14 having a depth c and a diameter w (>>c), as shown in FIG. 4A. In such case, the driving force for a small crack 15 propagating from the base 16 of the hole 14 is destabilizing and is given by:

$G\downarrow = 1.5\sigma^2 c/\overline{E}$, where $\overline{E}$ takes the plane strain form.

Figure 4B:
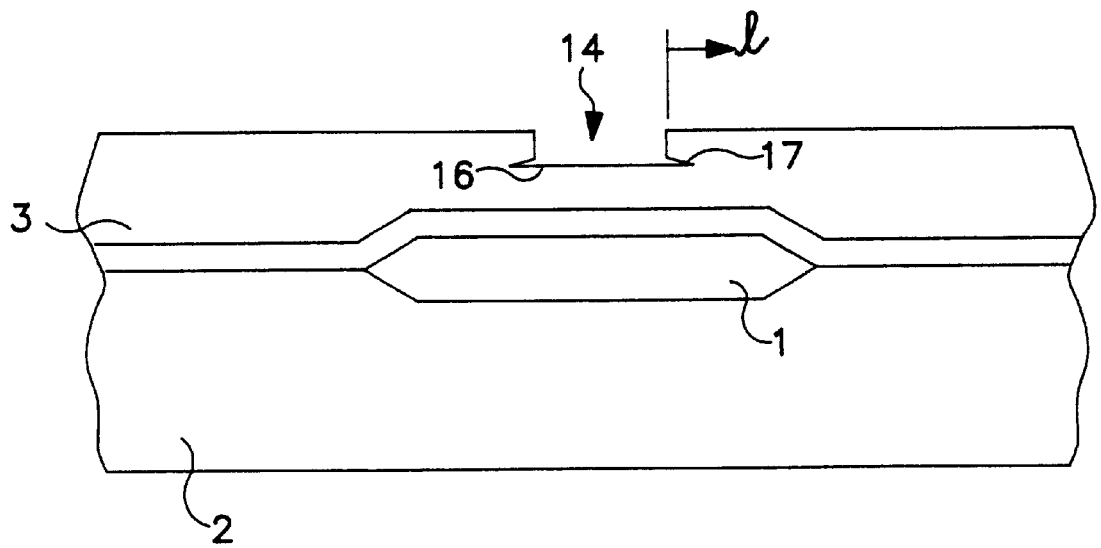

At a depth c, the initial driving force for an annular crack to propagate parallel to the surface from the periphery of the hole, as shown at 17 in FIG. 4B, is:

$$G_{\leftrightarrow}^0 = 0.5\sigma^2 c/\overline{E}.$$

This driving force is stabilizing, and decreases with annular crack extension according to:

$$G = G_{\leftrightarrow}^0 \frac{2}{[1 + v + 4(l/w)^2(1+v)]^2},$$

such that $$G_{\leftrightarrow}^{\infty} = 0.$$

Figure 4C:
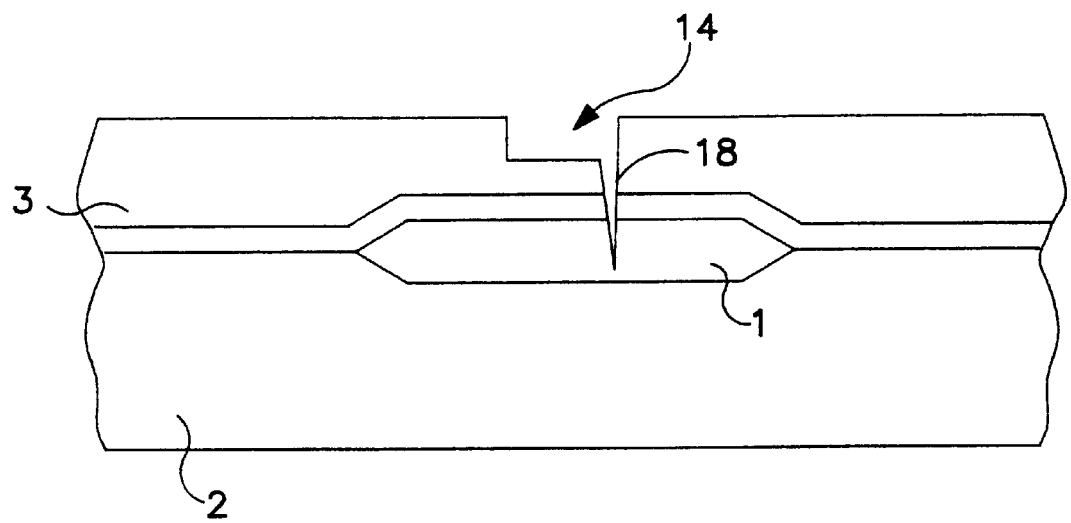
FIG. 4C is a schematic illustration of the wafer structure shown in FIGS. 4A and 4B, showing the propagation of a destabilizing crack.
Figure 4D:
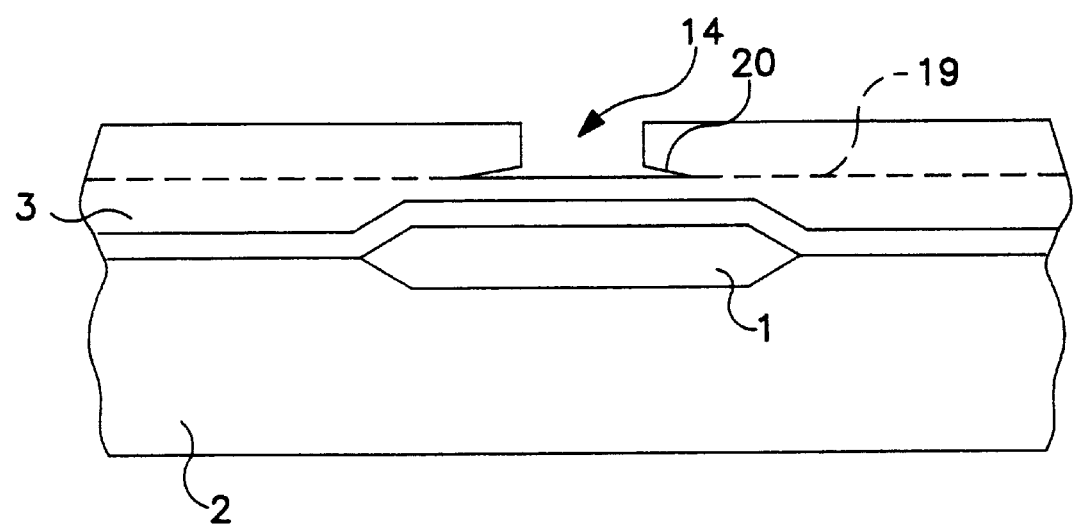
FIG. 4D is a schematic illustration of the wafer structure shown in FIGS. 4A and 4B, showing a crack that has been deflected and arrested.

The consequences of these relations are that:

(i) a small defect in the overlayer at the periphery of the hole will propagate from a position of unstable equilibrium with increasing velocity, as shown at 18 in FIG. 4C, if the condition:

$c > R_{mat}\overline{E}/1.5\sigma^2$, is met;

(ii) a weakened interface or layer 19 inserted into the BSG at a depth c will cause a small defect to propagate around the hole and outwardly, in an annular fashion, parallel to the surface, as shown at 20 in FIG. 4D, if the condition:

$R_{int} \le R_{mat}/3$, is met;

(iii) the annular crack will arrest at a length equal to the hole diameter for:

$R_{int}=R_{mat}/6.6$ (arrest at l=w), and at a length equal to its radius for:

$R_{int}=R_{mat}/6$ (arrest at l=0.5w).

In terms of material considerations, the fracture resistance of BSG in water is approximately $R=1.4$ J/m$^2$, requiring the fracture resistance of the weakened interface or interlayer to be about 0.45 to 0.35 J/m$^2$ in water for the delamination cracks to initiate from a downwardly propagating crack or a shallow hole. This is on the order of the fracture energies generated by van der Waal's or other surface forces between oxides, or about the fracture energy of a cured organic-inorganic hybrid SOG material. The implication is that appropriately weakened interfaces in the BSG can be created by an intermediate surface treatment of the BSG during deposition to leave a non-primary bonding interface in the overlayer, or by depositing a thin layer of SOG material that is well-bonded to the BSG, but which is itself weakly resistant to fracture. The interface or layer can be continuous or, with appropriate photolithographic steps, can be restricted to the proximity of the gate. Because SOG materials are known to be very good gap-fillers, a small trench etched into the BSG and then filled with a weaker material is possible. It should be noted, however, that any intermediate layers must be extremely thin so as not to perturb the elastic stress field in the structure, thereby altering the crack driving force field.

In practice, the foregoing improvements will find any of a number of useful applications. For example, plural interfaces or layers can be constructed above a gate oxide structure to ensure that a downwardly propagating crack is deflected. The interfaces or layers can be graded in terms of their fracture resistance so that critical deflections are maintained at all levels (e.g., interfaces further from the surface can be made more resistant to fracture to restrict sideways deflections to a fixed length, rather than a fixed proportion). Although the foregoing description is primarily directed to the CMP planarization of BSG over gate oxides, such improvements will apply equally to other applications. For example, any critical back-end-of-line (BEOL) interconnection structure could benefit from such protection, regardless of the source of the stress or the operating environment.

It will therefore be understood that various changes in the details, materials and arrangement of parts which have been herein described and illustrated in order to explain the nature of this invention may be made by those skilled in the art within the principle and scope of the invention as expressed in the following claims.

What is claimed:

1. A method for use in manufacturing an integrated circuit construction including a first layer defining operative circuit elements and formed on a substrate, and a second layer formed of a dielectric material and positioned over the first layer, the method comprising the steps of joining the first layer and the second layer at a controlled interface, and weakening the controlled interface relative to a direct connection established between the first layer and the second layer so that a crack formed in the first layer is prevented from propagating into the second layer.

2. The method of claim 1 wherein the first layer and the second layer are in contact with each other, and which further includes the step of interrupting the second layer relative to the first layer.

3. The method of claim 2 wherein the step of interrupting includes the step of poisoning the connection established between the first layer and the second layer.

4. The method of claim 3 wherein the step of poisoning includes the step of exposing the interconnection to a poisoning agent selected from the group consisting of Group VII elements including F, Cl, and Br; Group I elements including Li, Na, and K; Group II elements including Mg, Ca, Sr, and Ba; and Group V elements including P.

5. The method of claim 2 which further includes the step of forming the second layer of a spin-on glass material.

6. The method of claim 1 which further includes the step of forming the weakened interface as an intermediate layer connecting the first layer and the second layer.

7. The method of claim 6 which further includes the step of forming the intermediate layer with a thickness of less than about 200 Å.

8. The method of claim 6 which further includes the step of forming the intermediate layer of a spin-on glass material.

9. The method of claim 6 which further includes the step of forming the intermediate layer as a continuous layer, over the first layer.

10. The method of claim 6 which further includes the step of forming the intermediate layer as a discontinuous layer, over selected circuit elements of the first layer.

11. The method of claim 6 which further includes the step of forming the intermediate layer of polyimide.

12. The method of claim 1 wherein the second layer has a characteristic fracture resistance, wherein the crack is a linear crack, and which further includes the step of forming the interface with a fracture resistance which is between one-eighth and one-quarter of the fracture resistance of the second layer.

13. The method of claim 1 wherein the second layer has a characteristic fracture resistance, wherein the crack is a substantially circular crack, and which further includes the step of forming the interface with a fracture resistance which is between zero and one-third of the fracture resistance of the second layer.

14. The method of claim 1 wherein the crack is formed with a first portion which propagates in a direction toward the first layer and a second portion which propagates in a direction forming an angle with the first portion of the crack, and which further includes the step of controlling the interface so that the first length approximately equals the second length.

15. The method of claim 1 which further includes the step of forming a plurality of layers over the first layer, each of which includes a weakened interface.

16. The method of claim 1 which further includes the step of polishing the second layer to form a planar surface.

17. The method of claim 16 wherein the polishing step is a chemical-mechanical polishing procedure.

* * * * *

UNITED STATES PATENT AND TRADEMARK OFFICE
CERTIFICATE OF CORRECTION

PATENT NO. : 6,174,814 B1
DATED : January 16, 2001
INVENTOR(S) : Robert F. Cook et al.

It is certified that error appears in the above-identified patent and that said Letters Patent is hereby corrected as shown below:

Column 3,
Line 19, delete "When" and insert -- when --; and

Column 5,
Between lines 15 and 20, delete the formula in its entirety and insert Column 6,
Line 36, delete "farmed" and insert -- formed --;

Column 7,
Line 39, delete "V$^2$" and insert -- $v^2$ --;
Line 45, delete the formula in its entirety and insert $$-- G_{\leftrightarrow}^{0} = \sigma^2 c / \overline{E} = G\downarrow/4 \; --;$$

Line 61, before "(i)", insert -- The consequences of these relations are that: --;
Line 65, delete the equation in its entirety and insert $$-- c_0 \geq R_{mat}\overline{E} / 4\sigma^2, \; --;$$

Column 8,
Line 5, delete the equation in its entirety and insert -- $R_{int} \leq R_{mat}/4$, --;
Line 10, delete the equation in its entirety and insert -- $R_{int} \geq R_{mat}/8$, --;
Line 18, delete the equation in its entirety and insert -- $R_{int} \leq R_{mat}/8$, --; and
Line 67, delete the equation in its entirety and insert -- $R_{int} \leq R_{mat}/3$, --.

Signed and Sealed this

Twelfth Day of February, 2002

*Attest:*

*Attesting Officer*

JAMES E. ROGAN
*Director of the United States Patent and Trademark Office*